(12) United States Patent
Gupta et al.

(10) Patent No.: US 7,739,876 B2
(45) Date of Patent: Jun. 22, 2010

(54) SOCKET ENABLED CURRENT DELIVERY TO A THERMOELECTRIC COOLER TO COOL AN IN-SUBSTRATE VOLTAGE REGULATOR

(75) Inventors: Ashish Gupta, Chandler, AZ (US); David S. Chau, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 298 days.

(21) Appl. No.: 11/616,794

(22) Filed: Dec. 27, 2006

(65) Prior Publication Data

US 2008/0155990 A1 Jul. 3, 2008

(51) Int. Cl.
*F25B 21/02* (2006.01)
(52) U.S. Cl. .............................. 62/3.2; 62/3.7; 62/259.2
(58) Field of Classification Search .................... 62/3.2, 62/3.3, 3.7, 259.2
See application file for complete search history.

(56) References Cited

U.S. PATENT DOCUMENTS

| | | | | |
|---|---|---|---|---|
| 6,253,556 | B1 * | 7/2001 | Schendel | 62/3.7 |
| 6,743,972 | B2 * | 6/2004 | Macris | 136/201 |
| 6,826,916 | B2 * | 12/2004 | Shimada et al. | 62/3.2 |

* cited by examiner

*Primary Examiner*—Melvin Jones
(74) *Attorney, Agent, or Firm*—Kenneth A. Nelson

(57) ABSTRACT

An apparatus including a socket having a socket body and a cavity within the socket body. The apparatus further including a thermoelectric cooler coupled to an in-substrate voltage regulator positioned within the cavity. A method including coupling a thermoelectric cooler to an in-substrate voltage regulator positioned within a cavity of a socket and electrically coupling the thermoelectric cooler to the socket using a contact of the socket. A system including an electronic appliance having a processor including an in-substrate voltage regulator positioned within a cavity of a socket coupled to the processor. The system further including a thermoelectric cooler positioned within the cavity and coupled to the in-substrate voltage regulator.

14 Claims, 2 Drawing Sheets

US 7,739,876 B2

SOCKET ENABLED CURRENT DELIVERY TO A THERMOELECTRIC COOLER TO COOL AN IN-SUBSTRATE VOLTAGE REGULATOR

FIELD

Embodiments described herein generally relate to the field of integrated circuit package cooling, and more particularly, to socket enabled current delivery to a thermoelectric cooler for cooling of in-substrate voltage regulators.

BACKGROUND

The demand for small form-factor, high-speed computing systems has led to placing components such as voltage regulators on a substrate of an integrated circuit package. Voltage regulators have the potential to remove system board parasitic influences and improve on third, and possibly second, voltage droop. A voltage regulator, however, can produce a significant amount of heat that could impact the performance and reliability of the integrated circuit package.

BRIEF DESCRIPTION OF THE DRAWINGS

The features, aspects, and advantages of the invention will become more thoroughly apparent from the following detailed description, appended claims, and accompanying drawings that are used to illustrate embodiments of the invention. In the drawings:

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
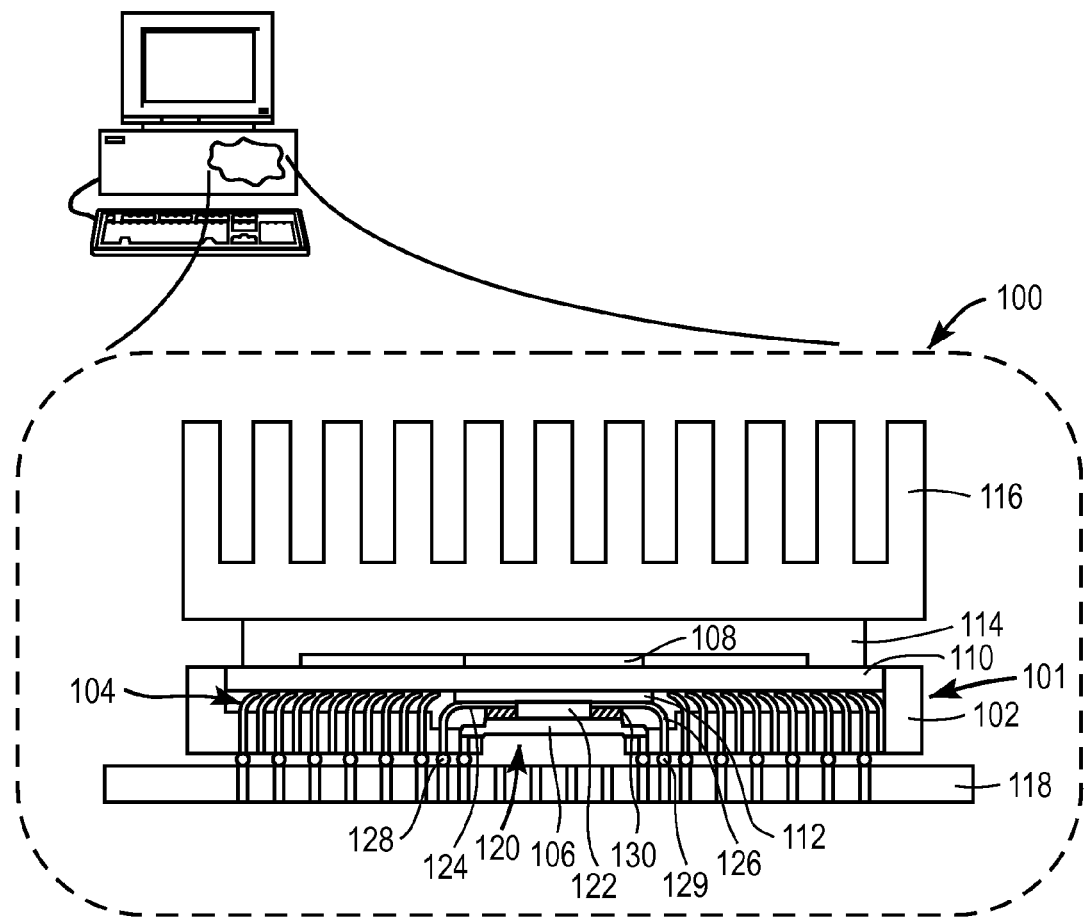
FIG. 1 shows a cross-sectional side view of socket enabled current delivery to a thermoelectric cooler to cool an in-substrate voltage regulator in connection with a computer system, in accordance with one embodiment.

FIG. 1 shows a cross-sectional side view of socket enabled current delivery to a thermoelectric cooler to cool an in-substrate voltage regulator, in accordance with one embodiment. In accordance with the illustrated embodiment, electronic assembly 100 includes one or more of socket 101 including a socket body 102, socket contacts 104, integrated heat spreader 106, die 108, substrate 110, in-substrate voltage regulator 112, die heat spreader 114, heat sink 116, and printed circuit board 118.

Socket body 102 represents a material such as plastic that provides mechanical support and attachment for an integrated circuit package and includes socket contacts 104 to electrically couple the integrated circuit package with traces and other components (not shown) on printed circuit board 118. In one embodiment, socket body 102 is a land grid array (LGA) socket with socket contacts 104 arranged around a substantially central cavity 120. Alternatively, socket body 102 may be any type of socket body deemed desirable. In some embodiments, socket contacts 104 are arranged around cavity 120 in a square pattern.

One or more of thermoelectric cooler 122 may be placed in cavity 120 to dissipate heat from in-substrate voltage regulator 112. In this aspect, thermoelectric cooler 122 is placed adjacent in-substrate voltage regulator 112. Thermoelectric cooler 122 may have any dimensions suitable for positioning thermoelectric cooler 122 within cavity 120 and cooling in-substrate voltage regulator 112. For example, thermoelectric cooler 122 may be a thin film, micro or nano sized thermoelectric cooler or any other similarly sized thermoelectric cooler. Thermoelectric cooler 122 may be made of any material suitable to dissipate heat from in-substrate voltage regulator 112, such as, thin film superlattices or nanocomposites.

In some embodiments, thermoelectric cooler 122 has substantially the same or smaller dimensions than that of in-substrate voltage regulator 112. For example, it is contemplated that in some embodiments, thermoelectric cooler 122 has substantially the same surface dimensions as in-substrate voltage regulator 112 such that the entire in-substrate voltage regulator 112 may be cooled by a single thermoelectric cooler 122. In other embodiments, such as that shown in FIG. 1, thermoelectric cooler 122 has a smaller surface dimension than in-substrate voltage regulator 112. In this aspect, thermoelectric cooler 122 may be positioned adjacent a hot spot of in-substrate voltage regulator so that it cools this portion of in-substrate voltage regulator 112. In this aspect, localized cooling of in-substrate voltage regulator 112 may be achieved. It is contemplated that more then one thermoelectric cooler 122 may be used where cooling of multiple localized regions of in-substrate voltage regulator 112 is deemed desirable. For example, in some embodiments, more than one thermoelectric cooler 122 could be placed thermally parallel to each other (next to each other) for cooling of different locations or in series (stacked on top of each other) to enhance a cooling load.

Integrated heat spreader 106 may further be placed in cavity 120 of socket body 102. Integrated heat spreader 106 may be used to dissipate heat from thermoelectric cooler 122 and in-substrate voltage regulator 112. In this aspect, a thermal impact of in-substrate voltage regulator 112 on assembly 100, and die 108 specifically, may be reduced.

Integrated heat spreader 106 may further be used to facilitate insertion of thermoelectric cooler 122 within cavity 120. Due to the dimensions of cavity 120 it may be difficult to position thermoelectric cooler 122 within cavity 120. In this aspect, thermoelectric cooler 122 may be connected to a flat surface of integrated heat spreader 106 as shown in FIG. 1 prior to inserting integrated heat spreader 106 in cavity 120. Integrated heat spreader 106 with thermoelectric cooler 122 attached may then be inserted into cavity 120 when the associated integrated circuit package is inserted in socket body 120. In this aspect, integrated heat spreader 106 provides support for thermoelectric cooler 122 within cavity 120.

Integrated heat spreader 106 may be made of copper, aluminum or any other metal or metal alloy that would be suitable for spreading heat. Integrated heat spreader 106 may be L-shaped with one end attached to socket body 102 and the other end floating over cavity 120, or U-shaped with two ends attached to socket body 102 on opposite sides of cavity 120, or basket-shaped with four sides attached to socket body 102 and a flat surface that covers cavity 120. In some embodiments, integrated heat spreader 106 is enclosed in socket 101 from four or less sides. Still further, integrated heat spreader 106 may be any other shape that allows integrated heat spreader 106 to attach to socket body 102 and provide a heat spreading surface to components within cavity 120.

Thermal interface material 130 may further be provided to promote adhesion and promote heat transfer between thermoelectric cooler 122, in-substrate voltage regulator 112 and integrated heat spreader 106. In some embodiments, thermal interface material 130 may be a paste, including, but not limited to, a thixotropic paste, carbon black paste or fluidic paste. In still further embodiments, thermal interface material could be a two-phase material. In other embodiments, thermal interface material 130 may be, but is not limited to, a sheet or foil such as a metal sheet, graphite sheet, aluminum foil or copper foil. It is further contemplated that thermal interface material 130 may be a nanoparticle loaded fluid, i.e. nanofluid. In some embodiments, it is contemplated that integrated heat spreader 106 may be omitted and thermal interface material 130 may be used to support thermoelectric cooler 122.

Electrical power may be delivered to thermoelectric cooler 122 through one or more of contacts 104. As illustrated in FIG. 1, contacts 124 and 126 adjacent cavity 120 are dimensioned to contact thermoelectric cooler 122 on one end and printed circuit board 118 on another end. In some embodiments, one end of contacts 124 and 126 may be in direct contact with, or soldered to, metal pads (not shown) on thermoelectric cooler 122. The other end of contacts 124 and 126 may be connected to printed circuit board 118 though solder balls 128 and 129, respectively. Contacts 124 and 126 may be of any size and shape suitable for contacting thermoelectric cooler 122. Contacts 124 and 126 may be of a same or different material than contacts 104 not connected to thermoelectric cooler. Although only contacts 124 and 126 are shown connected to thermoelectric cooler 122, it is contemplated that any number of contacts 104 deemed desirable may be connected to one or more of thermoelectric cooler 122. In this aspect, power may be delivered directly to thermoelectric cooler 122 through socket 102.

It is further contemplated that power may be delivered to thermoelectric cooler 122 by connecting contacts 124 and 126 to metal pads on heat spreader 106 applied to thermoelectric cooler 122. In this aspect, contact metal pads can be placed on heat spreader 106 and metal traces may be provided through heat spreader 106 to a point where heat spreader 106 contacts thermoelectric cooler 122. In this aspect, power to thermoelectric cooler 122 may be supplied through heat spreader 106. Alternatively, heat spreader 106 may be omitted and replaced with a heat sink having contact metal pads and metal traces to provide power to thermoelectric cooler 122.

Loading of socket 101 as described herein allows for multiple cooling components to be connected to assembly 100 without requiring any substantial form factor modifications to assembly 100. Although embodiments described herein may reduce a volume within socket cavity 120, it will not impact power delivery to assembly 100. In addition, assembly 100 as described herein allows heat to be directly transferred to printed circuit board 118 for heat dissipation. In this aspect, a lower thermal resistance path may be achieved than when cavity 120 is not loaded as described.

Electronic assembly 100 may be part of a processor of an electronic appliance such as a computer (e.g., desktop, laptop, hand-held, server, internet appliance, etc.), a wireless communications device (e.g., cellular phone, cordless phone, pager), a computer-related peripheral (e.g., printer, scanner, monitor), and entertainment device (e.g., television, radio, stereo, tape player, compact disc player, video cassette recorder, Motion Picture Experts Group, audio writer 3 (MP3) player and the like. FIG. 1 shows electronic assembly 100 that is part of a desktop computer.

Figure 2:
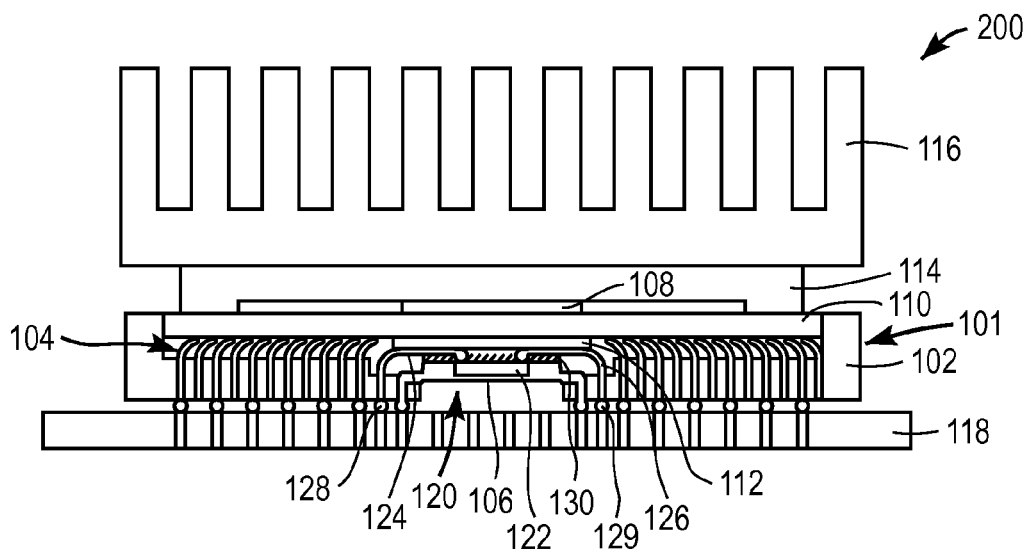
FIG. 2 shows a cross-sectional side view of socket enabled current delivery to a thermoelectric cooler to cool an in-substrate voltage regulator, in accordance with another embodiment.

FIG. 2 shows a cross-sectional side view of socket enabled current delivery to a thermoelectric cooler to cool an in-substrate voltage regulator, in accordance with another embodiment. In accordance with the illustrated embodiment, electronic assembly 200 includes one or more of socket 101 including socket body 102, socket contacts 104, integrated heat spreader 106, die 108, substrate 110, in-substrate voltage regulator 112, die heat spreader 114, heat sink 116, and printed circuit board 118. Socket body 102, socket contacts 104, die 108, substrate 110, in-substrate voltage regulator 112, die heat spreader 114, heat sink 116, and printed circuit board 118 are substantially similar to those described in reference to FIG. 1. Socket body 102 includes socket contacts 104 to electrically couple the integrated circuit package with traces and other components (not shown) on printed circuit board 118. Socket body 102 includes socket contacts 104 arranged around a substantially central cavity 120.

One or more of thermoelectric cooler 122 may be placed in cavity 120 to cool in-substrate voltage regulator 112. In this embodiment, thermoelectric cooler 122 is embedded within integrated heat spreader 106 and placed adjacent to in-substrate voltage regulator 112. Thermoelectric cooler 122 may be embedded within integrated heat spreader 106 by any suitable technique, such as forming a hole or depression within integrated heat spreader 106 and placing thermoelectric cooler 122 within the hole or depression.

Similar to the embodiment of FIG. 1, thermal interface material 130 may be provided to promote adhesion and heat transfer between thermoelectric cooler 122, in-substrate voltage regulator 112 and integrated heat spreader 106. In the embodiment illustrated in FIG. 2, thermal interface material 130 is placed between thermoelectric cooler 122 and in-substrate voltage regulator 112.

Power may be delivered directly to thermoelectric cooler 122 by contacts 124 and 126 of socket body 102 connected to thermoelectric cooler 122 on one end and printed circuit board 118 on another end through solder balls 128 and 129, respectively, as described in reference to FIG. 1. Although only contacts 124 and 126 are shown connected to thermoelectric cooler 122, it is contemplated that any number of contacts 104 deemed desirable may be connected to one or more of thermoelectric cooler 122. Alternatively, power may be delivered to thermoelectric cooler 122 through heat spreader 106 or a heat sink as described in reference to FIG. 1.

Figure 3:
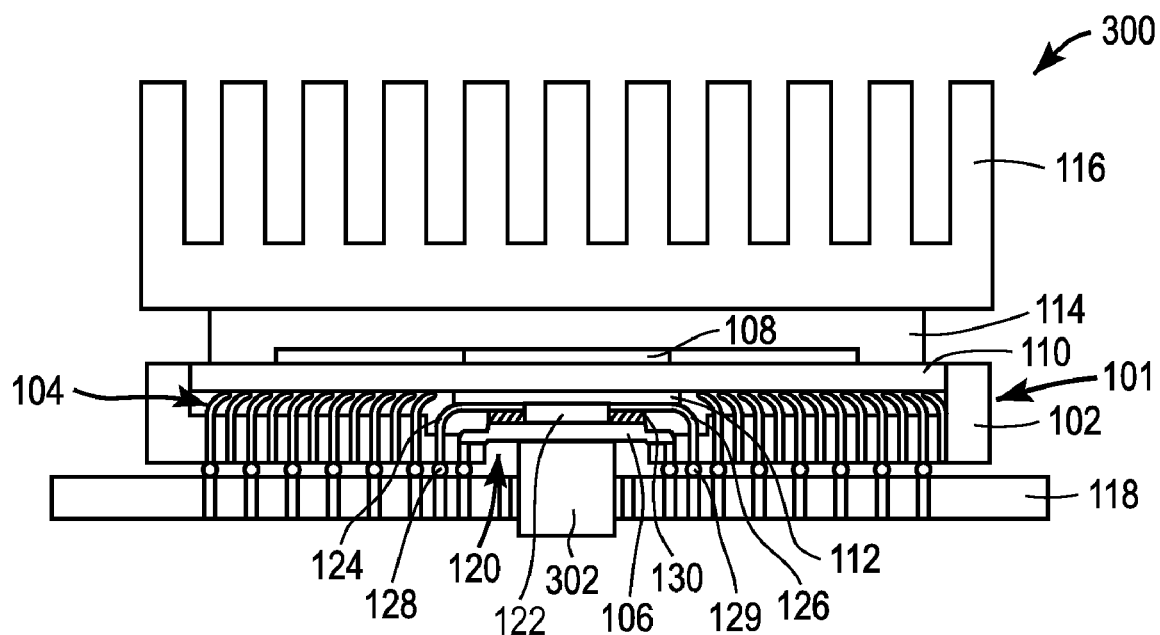
FIG. 3 shows a cross-sectional side view of socket enabled current delivery to a thermoelectric cooler to cool an in-substrate voltage regulator, in accordance with another embodiment.

FIG. 3 shows a cross-sectional side view of socket enabled current delivery to a thermoelectric cooler to cool an in-substrate voltage regulator, in accordance with another embodiment. In accordance with the illustrated embodiment, electronic assembly 300 includes one or more of socket 101 including a socket body 102, socket contacts 104, integrated heat spreader 106, die 108, substrate 110, in-substrate voltage regulator 112, die heat spreader 114, heat sink 116, thermal interface material 130 and printed circuit board 118. Socket body 102, socket contacts 104, die 108, substrate 110, in-substrate voltage regulator 112, die heat spreader 114, heat sink 116, integrated heat spreader 106, thermal interface material 130 and printed circuit board 118 are substantially similar to those described in reference to FIG. 1. Socket body 102 includes socket contacts 104 to electrically couple the integrated circuit package with traces and other components (not shown) on printed circuit board 118. Socket contacts 104 arranged around a substantially central cavity 120.

One or more of thermoelectric cooler 122 may be placed in cavity 120 to cool in-substrate voltage regulator 112. In this aspect, thermoelectric cooler 122 is positioned between integrated heat spreader 106 and in-substrate voltage regulator 112, by for example, connecting thermoelectric cooler 122 to a surface of integrated heat spreader 106 and then inserting integrated heat spreader 106 within cavity 120. Similar to the embodiment of FIG. 1, thermal interface material 130 may be provided to promote adhesion and heat transfer between thermoelectric cooler 122, in-substrate voltage regulator 112 and integrated heat spreader 106.

Power may be delivered directly to thermoelectric cooler 122 by contacts 124 and 126 of socket body 102 connected to thermoelectric cooler 122 on one end and printed circuit board 118 on another end through solder balls 128 and 129, respectively, as described in reference to FIG. 1. Although only contacts 124 and 126 are shown connected to thermoelectric cooler 122, it is contemplated that any number of contacts 104 deemed desirable may be connected to one or more of thermoelectric cooler 122. Alternatively, power may be delivered to thermoelectric cooler 122 through heat spreader 106 or a heat sink as described in reference to FIG. 1.

An additional cooling component 302 may be connected to integrated heat spreader 106 by any suitable technique when further cooling is deemed desirable. In some embodiments, cooling component 302 may be a heat sink, a heat pipe or a cold plate of a microchannel liquid cooler.

Figure 4:
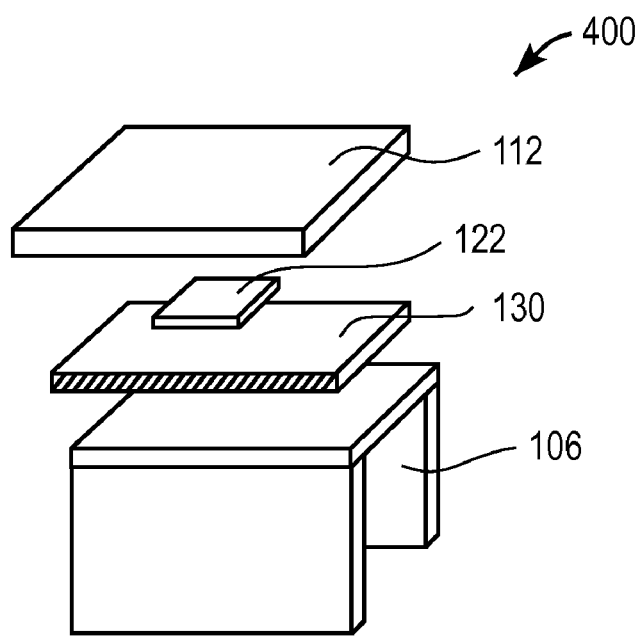
FIG. 4 shows an exploded view of a thermoelectric cooler to cool an in-substrate voltage regulator, in accordance with one embodiment.

FIG. 4 shows an exploded view of a thermoelectric cooler to cool an in-substrate voltage regulator, in accordance with one embodiment. In accordance with the illustrated embodiment, in-substrate voltage regulator 112, thermoelectric cooler 122, thermal interface material 130 and integrated heat spreader 106 are shown prior to assembly. In this embodiment, thermoelectric cooler 122 is smaller than in-substrate voltage regulator 112. In this aspect, when assembled, thermoelectric cooler 122 will cool a localized area of in-substrate voltage regulator 112 adjacent the surface of thermoelectric cooler 122. Integrated heat spreader 106 is shown substantially U-shaped with two ends. Each of the ends may be attached to socket body 102 on opposite sides of cavity 120.

In the preceding detailed description, specific embodiments are illustrated, including techniques for socket enabled current delivery to a thermoelectric cooler to cool an in-substrate voltage regulator. It will, however, be evident that various modifications and changes may be made thereto without departing from the broader spirit and scope of the invention as set forth in the claims. For example, cooling components described herein may be modified to accommodate various form factor limitations of the electronic assembly, for example, the mechanical envelope designed for some standard computer chassis. It is contemplated that, the cooling configuration described herein is suitable for use with a wide variety of electronic appliances that would benefit from the embodiments described herein. The specification and drawings are, accordingly, to be regarded in an illustrative rather than a restrictive sense.

What is claimed is:

1. An apparatus comprising:
   a socket comprising a socket body and a cavity within the socket body;
   a thermoelectric cooler coupled to an in-substrate voltage regulator positioned within the cavity; and
   a thermal interface material coupled to the in-substrate voltage regulator and the thermoelectric cooler.

2. The apparatus of claim 1, wherein the socket comprises a set of contacts and at least one of the contacts is electrically coupled to the thermoelectric cooler.

3. The apparatus of claim 1, further comprising:
   an integrated heat spreader coupled to the thermoelectric cooler.

4. The apparatus of claim 3, wherein the thermoelectric cooler is embedded in the integrated heat spreader.

5. An apparatus comprising:
   a socket comprising a socket body and a cavity within the socket body;
   a thermoelectric cooler coupled to an in-substrate voltage regulator positioned within the cavity; and
   one of a heat pipe, a cold plate of a microchannel liquid cooler and a heat sink thermally coupled to the thermoelectric cooler.

6. The apparatus of claim 1, wherein more than one thermoelectric cooler is coupled to the in-substrate voltage regulator.

7. A method comprising:
   coupling a thermoelectric cooler to an in-substrate voltage regulator positioned within a cavity of a socket;
   electrically coupling the thermoelectric cooler to the socket using a contact of the socket; and
   thermally coupling one of a heat sink, a cold plate of a microchannel liquid cooler and a heat pipe to the thermoelectric cooler.

8. The method of claim 7, further comprising:
   coupling an integrated heat spreader to the thermoelectric cooler.

9. The method of claim 8, wherein coupling the integrated heat spreader to the thermoelectric cooler comprises embedding the thermoelectric cooler in the integrated heat spreader.

10. A method comprising:
    coupling a thermoelectric cooler to an in-substrate voltage regulator positioned within a cavity of a socket;
    electrically coupling the thermoelectric cooler to the socket using a contact of the socket; and
    thermally coupling a thermal interface material to the in-substrate voltage regulator and the thermoelectric cooler.

11. A system comprising:
    an electronic appliance comprising:
      a processor including an in-substrate voltage regulator positioned within a cavity of a socket coupled to the processor;
      a thermoelectric cooler positioned within the cavity and coupled to the in-substrate voltage regulator, wherein a contact of the socket is electrically coupled to the thermoelectric cooler; and
      an integrated heat spreader coupled to the thermoelectric cooler, wherein the thermoelectric cooler is embedded in the integrated heat spreader.

12. A system comprising:
    an electronic appliance comprising:
      a processor including an in-substrate voltage regulator positioned within a cavity of a socket coupled to the processor;
      a thermoelectric cooler positioned within the cavity and coupled to the in-substrate voltage regulator; and
      a thermal interface material coupled to the in-substrate voltage regulator and the thermoelectric cooler.

13. A system comprising:
    an electronic appliance comprising:
      a processor including an in-substrate voltage regulator positioned within a cavity of a socket coupled to the processor;

a thermoelectric cooler positioned within the cavity and coupled to the in-substrate voltage regulator; and
one of a heat sink, cold plate of a microchannel liquid cooler and a heat pipe thermally coupled to the thermoelectric cooler.

14. The system of claim 11, wherein more than one thermoelectric cooler is coupled to the in-substrate voltage regulator.

* * * * *